US010972105B1

(12) United States Patent
Chattopadhyay (10) Patent No.: US 10,972,105 B1
(45) Date of Patent: Apr. 6, 2021

(54) CLOCK GENERATION AND CORRECTION CIRCUIT

(71) Applicant: Synopsys, Inc., Mountain View, CA (US)

(72) Inventor: Biman Chattopadhyay, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/718,830

(22) Filed: Dec. 18, 2019

(30) Foreign Application Priority Data

Oct. 21, 2019 (IN) .............................. 201941042608

(51) Int. Cl.
*H03L 7/07* (2006.01)
*G06F 1/08* (2006.01)
*H03L 7/197* (2006.01)
*H03L 7/08* (2006.01)

(52) U.S. Cl.
CPC ................. *H03L 7/07* (2013.01); *G06F 1/08* (2013.01); *H03L 7/0807* (2013.01); *H03L 7/1976* (2013.01)

(58) Field of Classification Search
CPC ....................................................... H03L 7/07
USPC ......................................................... 375/376
See application file for complete search history.

(56) References Cited

U.S. PATENT DOCUMENTS

| 5,907,587 | A | * | 5/1999 | Sokoler | ................. | H04L 7/042 375/366 |
| 2011/0188551 | A1 | * | 8/2011 | Shin | ..................... | H04B 1/38 375/219 |
| 2016/0013922 | A1 | * | 1/2016 | Su | ..................... | H04L 12/4633 370/436 |
| 2018/0219416 | A1 | * | 8/2018 | Van Wageningen | .... | H02J 50/12 |
| 2020/0099337 | A1 | * | 3/2020 | Powell | ..................... | H03B 5/26 |

* cited by examiner

*Primary Examiner* — Lihong Yu
(74) *Attorney, Agent, or Firm* — Fenwick & West LLP (57) ABSTRACT

A clock generation and correction (CGC) circuit comprises a clock and data recovery (CDR) circuit, a start-of-frame (SOF) detector circuit, a counter, a digital logic circuit, a fractional-N phase locked loop (PLL), and an oscillator circuit. The CDR receives an input data signal and an internal clock signal and generates a recovered data signal. The SOF detector circuit generates a toggle signal based on a comparison of the recovered data signal to a predetermined data signal pattern. The counter generates a clock cycle count signal based on the toggle signal. The digital logic circuit generates a frequency adjustment signal based on an error in the frequency of the clock signal. The oscillator circuit generates an intermediate clock signal. The fractional-N PLL circuit receives the frequency adjustment signal and the intermediate clock signal and modifies the internal clock signal based on the frequency adjustment signal.

18 Claims, 4 Drawing Sheets

CLOCK GENERATION AND CORRECTION CIRCUIT

CROSS REFERENCE TO RELATED APPLICATIONS

This application claims the right of priority based on India Provisional Application Serial No. 201941042608, entitled "Clock Generation And Correction Circuit", filed Oct. 21, 2019, which is incorporated by reference in its entirety.

BACKGROUND

1. Field of Art

The present disclosure relates generally to communication systems, and more specifically, to clock generation and correction (CGC) circuits.

2. Description of the Related Art

Data communication systems are constantly adapted to serve the ever-increasing need for high speed data communication. Data communication systems require highly accurate clocks to coordinate actions of the system. Clocks provide a type of signal (e.g., a clock signal) that oscillates between a high state and a low state. Clock signals are generated by oscillators. Currently, on-chip oscillators (e.g., a resistor-capacitor (RC) oscillator) and external crystal oscillators may be used to create an electrical signal (e.g., a local clock signal) with precise frequency. However, the on-chip oscillators provide poor frequency stability and the external crystal oscillators consume additional area on the chip, which increases cost of the device.

In an embodiment, that utilizes an Universal Serial Bus (USB) communication system, a host device, such as a personal computer, a laptop, and the like, is included and in communication with a USB device, such as a mouse, a keyboard, or an external hard drive. The host device communicates with the USB device based on standards that specify various data transmission rates for different modes of communication. For example, the USB 1.0 standard specifies data transmission rates of 12 Megabits per second (Mbps) for a Full Speed mode and 1.5 Mbps for a Low Speed mode.

When communicating with the host device, the USB device requires a local clock signal with an accuracy of ±2,500 parts per million (PPM) or greater. To generate this accurate clock signal, conventional USB devices include an oscillator circuit. The oscillator circuit is typically an on-chip oscillator, such as the RC oscillator. However, the RC oscillator provides poor frequency stability in the generation of the local clock signal, thus affecting the desired accuracy.

To solve the aforementioned problem, the oscillator circuit may be implemented with an external oscillator component such as an external quartz crystal or a ceramic resonator, in the USB device. However, as explained above, using an external oscillator component with the oscillator circuit increases the overall cost of the USB device and consumes additional area on the chip. Further, the local clock signal generated by the oscillator circuit with the external oscillator component has a fixed frequency. Hence, additional circuitry is required for obtaining accurate clock signals at various frequencies.

In light of the foregoing, it would be advantageous to have a clock generation and correction circuit that generates an accurate local clock signal, i.e., a clock signal having an accuracy of ±2,500 PPM or higher, without using an external oscillator component. Additionally, the clock generation and correction circuit should be able to provide the local clock signals at various frequencies or correct the local clock signals to obtain desired frequencies.

SUMMARY

The present disclosure describes a combination of components which constitutes a clock generation and correction (CGC) circuit to enhance the accuracy of the clock signal for data transmission. The components of the CGC circuit and the method steps performed by the CGC circuit have been represented, showing only specific details that are pertinent for an understanding of the CGC circuit so as not to obscure the disclosure with details that will be readily apparent to those with ordinary skill in the art having the benefit of the description herein. Detailed embodiments are disclosed herein; however, it is to be understood that the disclosed embodiments are merely exemplary, and the CGC circuit can be embodied in various forms. Therefore, specific structural and functional details disclosed herein are not to be interpreted as limiting, but merely as a basis for the claims and as a representative basis for teaching one skilled in the art to variously employ the CGC circuit in virtually any appropriately detailed structure. Further, the terms and phrases used herein are not intended to be limiting but rather to provide an understandable description.

The CGC circuit can be used in any data communication system in which the data received includes predetermined data signal patterns and particular time markers embedded in the data pay-load. The predetermined data signal patterns and particular time markers are used to extract timing accuracy information and adjust the local clock's frequency for data transmission.

In an embodiment, a CGC circuit is provided. The CGC circuit receives an input data signal from a host device. The CGC circuit generates a local clock signal that is frequency adjusted to enhance an accuracy of the clock signal for data transmission. The CGC circuit comprises a clock and data recovery (CDR) circuit, a start-of-frame (SOF) detector circuit, a counter, a digital logic circuit, an oscillator, and a fractional-N Phase Lock Loop (PLL). The CDR circuit receives the input data signal and the local clock signal. The CDR circuit generates a recovered data signal, which is an oversampled input data signal based on the local clock signal. The SOF detector circuit receives the recovered data signal and generates a toggle signal based on a comparison of the recovered data signal to a predetermined data signal pattern. The counter receives the local clock signal and the toggle signal and generates a clock cycle count signal based on the toggle signal. The digital logic circuit receives the toggle signal and the clock cycle count signal. The digital logic circuit generates a frequency adjustment signal based on an error in the frequency of the local clock signal. The oscillator circuit generates an intermediate clock signal. The fractional-N PLL circuit receives the frequency adjustment signal and the intermediate clock signal and modifies the intermediate clock signal based on the frequency adjustment signal. The fractional-N PLL outputs the frequency-adjusted intermediate clock signal as the local clock signal. Thus, the CGC circuit corrects the frequency of the local clock signal to enhance the accuracy of the local clock signal and further enhance the accuracy of data transmission in the communication system.

The CGC circuit accurately generates the local clock signal without an external timing component such as the quartz crystal resonator. The CGC circuit can also modify the frequency of the local clock signal based on operational requirements of the host device.

BRIEF DESCRIPTION OF THE DRAWINGS

The disclosed embodiments have other advantages and features which will be more readily apparent from the detailed description, the appended claims, and the accompanying figures (or drawings). A brief introduction of the figures is below.

Figure (FIG. 1A is a schematic block diagram of a clock generation and correction (CGC) circuit, in accordance with one or more embodiments.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

System Environment

Figure 1A:
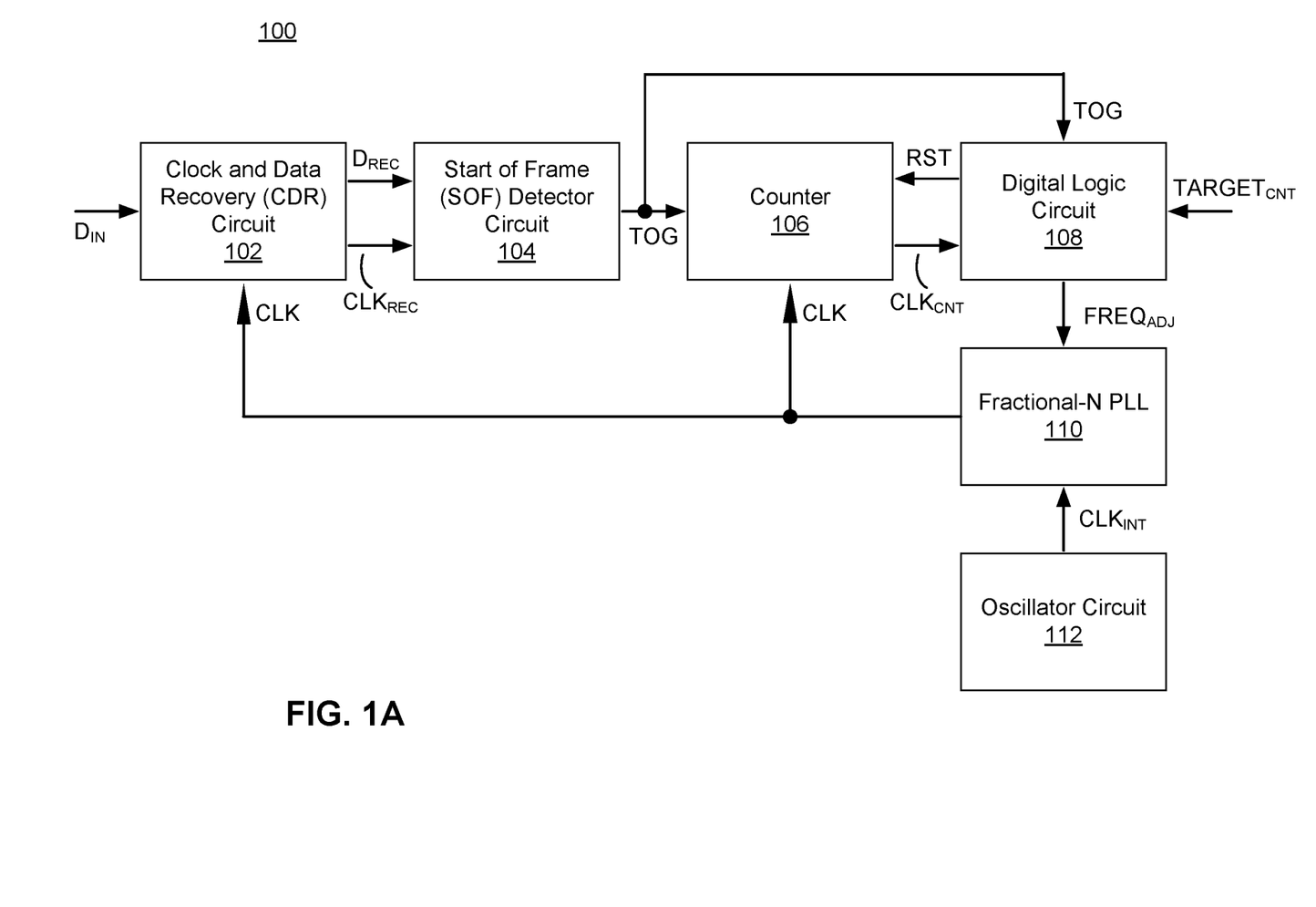

Figure (FIG.) 1A is a schematic block diagram of a clock generation and correction (CGC) circuit 100, in accordance with one or more embodiments. The CGC circuit 100 may be implemented in a Universal Serial Bus (USB) device (not shown) of a USB communication system (not shown). The CGC circuit 100 includes a clock and data recovery (CDR) circuit 102, a start-of-frame (SOF) detector circuit 104, a counter 106, a digital logic circuit 108, a fractional-N Phase Lock Loop (PLL) 110, and an oscillator circuit 112. Each component of the CGC circuit 100 may be implemented as a hardware module. The CDR circuit 102, the SOF detector circuit 104, the counter 106, the digital logic circuit 108, and the fractional-N PLL 110, also are configured to form a feedback loop.

The CDR circuit 102 is a circuit that receives a data signal and generates a recovered clock signal and a recovered data signal. In one embodiment, the CDR circuit 102 may receive an input data signal DIN from a data transmitter over a communication channel (e.g., a USB cable (not shown) from a host device (not shown) of the USB communication system). The input data signal DIN includes a sequence of frames, where one or more frames include a predetermined data signal pattern that takes place at a particular time marker. The predetermined data signal pattern is a fixed bit pattern. In one embodiment, the predetermined data signal pattern may take place at a particular time marker, e.g., the start-of-frame (SOF). The predetermined data signal pattern for this embodiment is referred to as a SOF packet. In some embodiments, the predetermined data signal pattern is determined by the device protocols. In one example, the CDR circuit 102 receives the predetermined data signal pattern at particular time marker intervals, such as at particular time marker intervals of 1 millisecond (ms). The CDR circuit 102 may further receive a clock signal CLK. The clock signal CLK is an internal local clock signal of the CGC circuit 100. The CDR circuit 102 is an oversampling CDR circuit and oversamples the input data signal DIN based on the clock signal CLK to generate a recovered data signal $D_{REC}$. The recovered data signal $D_{REC}$ includes the predetermined data signal pattern.

The CDR circuit 102 operates at a desired frequency of the clock signal CLK. The desired frequency of the clock signal CLK may be calculated by multiplying the data transmission rate of the input data signal DIN and an oversampling factor 'k'. The data transmission rate is the speed with which a data signal can be transmitted from one device to another. The oversampling factor 'k' is an integer value and may be determined by the design requirement of the CDR circuit 102. In one embodiment, where the data is transmitted using a USB 2.0 Full-Speed standard, the data transmission rate of the data signal DIN is 12 megabits per second (Mbps) and the oversampling factor 'k' is four. Thus, the desired frequency of the clock signal CLK is 48 megahertz (MHz). Additionally, the CDR circuit 102 generates a recovered clock signal $CLK_{REC}$. It will be apparent to a person skilled in the art that the recovered clock signal $CLK_{REC}$ is phase and frequency synchronized with the recovered data signal $D_{REC}$.

The SOF detector circuit 104 is a comparator circuit. In one embodiment, the SOF detector circuit 104 compares two signals. The SOF detector circuit 104 is connected to the CDR circuit 102 and receives the recovered data signal $D_{REC}$ and recovered clock signal $CLK_{REC}$. The predetermined data signal pattern, as described above, is stored in the SOF detector circuit 104. In some embodiments, the predetermined data signal pattern may be a sequence of bits indicative of a typical SOF packet. In other embodiments, the predetermined data signal pattern may be determined by the device protocol. In other embodiments, the predetermined data signal pattern may be sent at particular time marker intervals.

The SOF detector circuit 104 compares the recovered data signal $D_{REC}$ with the predetermined data signal pattern. Based on the comparison, the SOF detector circuit 104 may detect the presence of the predetermined data signal pattern in the recovered data signal $D_{REC}$ and may generate a toggle signal TOG. The toggle signal TOG is a digital signal having a logic low state (i.e., "0") or a logic high state (i.e., "1"). When the SOF detector circuit 104 detects the predetermined data signal pattern in the recovered data signal $D_{REC}$, the SOF detector circuit 104 toggles the toggle signal TOG from either a logic low state to a logic high state or from a logic high state to a logic low state.

The counter 106 is a device which stores the number of times a particular event occurs in relation to a clock signal. The counter 106 is connected to the SOF detector circuit 104 and receives the clock signal CLK and the toggle signal TOG. In an embodiment, the counter 106 may be activated when the toggle signal TOG is at logic high state, and the counter 106 may be deactivated when the toggle signal TOG is at logic low state. When the counter 106 is activated, the counter 106 counts clock cycles and generates a clock cycle count $CLK_{CNT}$. The clock cycle count $CLK_{CNT}$ indicates a count of the clock cycles that have elapsed in a time interval between two consecutive predetermined data signal patterns of the recovered data signal $D_{REC}$. In one embodiment, when the toggle signal TOG toggles from logic low state to logic high state, the counter 106 may initiate counting of clock cycles of the clock signal CLK to generate the clock cycle count $CLK_{CNT}$. In one embodiment, when the toggle signal TOG toggles from logic high state to logic low state, the counter 106 may terminate counting of the clock cycles.

The counter 106 also receives a reset signal RST. In one embodiment, when the reset signal RST is at logic low state, the counter 106 may increment the clock cycle count $CLK_{CNT}$ by one for every clock cycle of the clock signal CLK. In the same embodiment, when the reset signal RST is at logic high state, the counter 106 resets the clock cycle count $CLK_{CNT}$ to zero.

The digital logic circuit 108 is a logic circuit connected to the counter 106 and the SOF detector circuit 104. The digital logic circuit 108 receives the clock cycle count $CLK_{CNT}$ and the toggle signal TOG, respectively. In one embodiment, when the toggle signal TOG toggles from logic high state to logic low state, the digital logic circuit 108 stores the value of the clock cycle count $CLK_{CNT}$.

The digital logic circuit 108 also receives a target count $TARGET_{CNT}$. The target count $TARGET_{CNT}$ value is a desired count of clock cycles. This value is determined based on the desired frequency of the clock signal CLK, a design specific parameter, and the time interval between two consecutive predetermined data signal patterns of the recovered data signal $D_{REC}$, a protocol specific parameter. For example, if the time interval between two consecutive predetermined data signal patterns is 1 ms, and the desired frequency of the clock signal CLK is 48 MHz, then the target count $TARGET_{CNT}$ has a value of 48,000.

The digital logic circuit 108 further subtracts the value of the target count $TARGET_{CNT}$ from the value of the stored clock cycle count $CLK_{CNT}$ to generate an error count $ERR_{CNT}$. The error count $ERR_{CNT}$ is an error in the frequency of the clock signal CLK with reference to the desired frequency. A positive value of the error count $ERR_{CNT}$ indicates that the frequency of the clock signal CLK is higher than the desired frequency. A negative value of the error count $ERR_{CNT}$ indicates that the frequency of the clock signal CLK is lower than the desired frequency. The digital logic circuit 108 generates a frequency adjustment signal $FREQ_{ADJ}$ based on the error count $ERR_{CNT}$. The frequency adjustment signal $FREQ_{ADJ}$ is a multi-bit code and it will be understood by a person skilled in the art that the frequency adjustment signal $FREQ_{ADJ}$ may have any number of bits. In one example, the frequency adjustment signal $FREQ_{ADJ}$ may be an 11-bit code where the most significant bit (MSB) of the frequency adjustment signal $FREQ_{ADJ}$ may indicate a sign of the error count $ERR_{CNT}$. The other bits of the frequency adjustment signal $FREQ_{ADJ}$ may indicate the value of the error count $ERR_{CNT}$. Thus, the frequency adjustment signal $FREQ_{ADJ}$ may be proportional to the error count $ERR_{CNT}$ and may also give direction so the clock signal frequency may be adjusted accordingly.

The fractional-N PLL 110 is a phase-locked loop control system. The loop accepts an input clock signal and outputs a frequency-adjusted clock signal such that the output clock signal frequency and the input clock signal frequency are related by the ratio 'N'. The ratio 'N' includes an integer coefficient T and a fractional coefficient 'F'. The fractional-N PLL 110 is connected to the digital logic circuit 108 and receives the frequency adjustment signal $FREQ_{ADJ}$. The fractional-N PLL 110 also receives an intermediate clock signal $CLK_{INT}$ (i.e., the intermediate clock signal $CLK_{INT}$ generated by the oscillator circuit 112, described in more detail below). The intermediate clock signal $CLK_{INT}$ is considered the input clock signal for the fractional-N PLL 110. The fractional-N PLL 110 modifies the frequency of the intermediate clock signal $CLK_{INT}$ based on the frequency adjustment signal $FREQ_{ADJ}$. The modified clock signal CLK is output from the fractional-N PLL 110 and is provided as the input clock signal CLK to the CDR circuit 102. As such, the clock signal CLK is both an input signal and an output signal for the CGC circuit 100. Thus, the CDR circuit 102, the SOF detector circuit 104, the counter 106, the digital logic circuit 108, and the fractional-N PLL 110, form a feedback loop.

In the fractional-N PLL 110, the modification to the clock signal CLK may take place by multiplying the frequency of intermediate clock signal $CLK_{INT}$ by a ratio 'N' to generate a corrected frequency for the clock signal CLK. A relationship between the frequency '$F_2$' of the clock signal CLK and a frequency '$F_1$' of the intermediate clock signal $CLK_{INT}$ is given by equations (1) and (2):

$$F_2 = F_1 * (N) \tag{1}$$

$$\text{i.e., } F_2 = F_1 * (I+F) \tag{2}$$

Thus, in one embodiment, at the start of data communication, the ratio 'N' has a value of one since the frequency of the clock signal CLK is equal to the frequency of the intermediate clock signal $CLK_{INT}$. In another embodiment, the ratio 'N' has a value of 3.5 with the frequency of the clock signal CLK being 3.5 times the frequency of the intermediate clock signal $CLK_{INT}$. As data communication commences, the ratio 'N' may change. The fractional-N PLL 110 may modify the frequency of the clock signal CLK by multiplying the intermediate clock signal $CLK_{INT}$ with the updated values of the ratio 'N'. For example, the target count $TARGET_{CNT}$ is 48,000 and the minimum value of the error count $ERR_{CNT}$ is one. Thus, the updated value of the ratio 'N,' which the fractional-N PLL 110 will use to modify the frequency of the clock signal CLK, may be calculated by (1) dividing the error count $ERR_{CNT}$ value by the target count $TARGET_{CNT}$ value, i.e., 1/48,000 or 20.83 PPM, and (2) subtracting the quotient from the previous value of the ratio 'N', assume the previous value of the ratio 'N' is one, i.e., $1-20.83 \times 10^{-6}$ or 0.99998.

The oscillator circuit 112 produces a periodic, oscillating electronic signal (i.e., the intermediate clock signal $CLK_{INT}$). The frequency of the intermediate clock signal $CLK_{INT}$ is determined based on the desired frequency of the clock signal CLK. The frequency of the intermediate clock signal $CLK_{INT}$ will vary due to various elements of the CGC circuit 100 and/or various elements of the larger data communication system that contains the CGC circuit 100. Specifically, variations may be attributed to differences in physical composition, temperature, path length, and voltages. The generated intermediate clock signal $CLK_{INT}$ is provided to the fractional-N PLL 110, where the intermediate clock signal $CLK_{INT}$ is corrected (e.g., via frequency adjustment). In one embodiment, the oscillator circuit 112 may be a resistor-capacitor (RC) oscillator circuit.

In an exemplary scenario, the data transmission rate of the data signal DIN is 12 Mbps, the predetermined data signal pattern is received at particular time marker intervals of 1 ms, the oversampling factor 'k' is 4, the desired frequency of the clock signal CLK is 48 MHz. The data communication system has been operational for some time and the actual frequency of the clock signal CLK is 48.012 MHz. Initially, the toggle signal TOG is at the logic low state. When the predetermined data signal pattern is detected in the recovered data signal $D_{REC}$, the SOF detector circuit 104 toggles the toggle signal TOG from the logic low state to the logic high state. The counter 106 initiates counting of the clock cycles of the clock signal CLK to generate the clock cycle count $CLK_{CNT}$. In this example, the value of the clock cycle count $CLK_{CNT}$ is 48,012. The SOF detector circuit 104 further detects a second predetermined data signal pattern in the recovered data signal $D_{REC}$ and toggles the toggle signal TOG from the logic high state to the logic low state, which further causes the reset signal RST to transition from the logic low state to the logic high state. Further, the digital logic circuit 108 subtracts the value of the predetermined target count $TARGET_{CNT}$ (e.g., 48,000) from the value of the clock cycle count $CLK_{CNT}$ to determine the error count $ERR_{CNT}$ that has a value of 12. The digital logic circuit 108 further generates the frequency adjustment signal $FREQ_{ADJ}$ as [00000001100]. On receiving the frequency adjustment signal $FREQ_{ADJ}$, the fractional-N PLL 110 modifies the value of the ratio 'N' accordingly by (1) dividing the error count $ERR_{CNT}$ value by the target count $TARGET_{CNT}$ value, i.e., 12/48,000 or 250 PPM, and (2) subtracting the quotient from the previous value of the ratio 'N', assume the previous value of the ratio 'N' is one, i.e., 1−250×10' or 0.99975. The frequency of the clock signal CLK is hence decreased by 250 PPM such that the count of clock cycles elapsed in the time interval between two consecutive predetermined data signal patterns is equal to the target count $TARGET_{CNT}$. Thus, the frequency of the clock signal CLK is corrected to the desired frequency.

The CGC circuit 100 does not require an external timing component, such as an external quartz crystal resonator, to generate an accurate local clock signal, e.g., the clock signal CLK for operating the USB device. The CGC circuit 100 further corrects the frequency of the clock signal CLK by way of the periodic predetermined data signal pattern occurrences. For a USB 2.0 Full-Speed standard mode of communication, the SOF packets are received at time intervals of 1 ms by the CGC circuit 100. Thus, the fractional-N PLL 110 is able to modify the frequency of the clock signal CLK at a rate of 500 PPM, thereby achieving an accuracy greater than ±2,500 PPM for the clock signal CLK. Further, the desired frequency of the clock signal CLK is based on the oversampling factor 'k' and the frequency of the data signal DIN. Thus, if the data signal DIN is transmitted at a different transmission rate, or the oversampling factor 'k' is changed, the desired frequency of the clock signal CLK also changes. Using the CGC circuit 100, the frequency of the clock signal CLK can be modified by modifying the ratio 'N'. Thus, the CGC circuit 100 is able to generate the clock signal CLK at multiple frequencies.

Figure 1B:
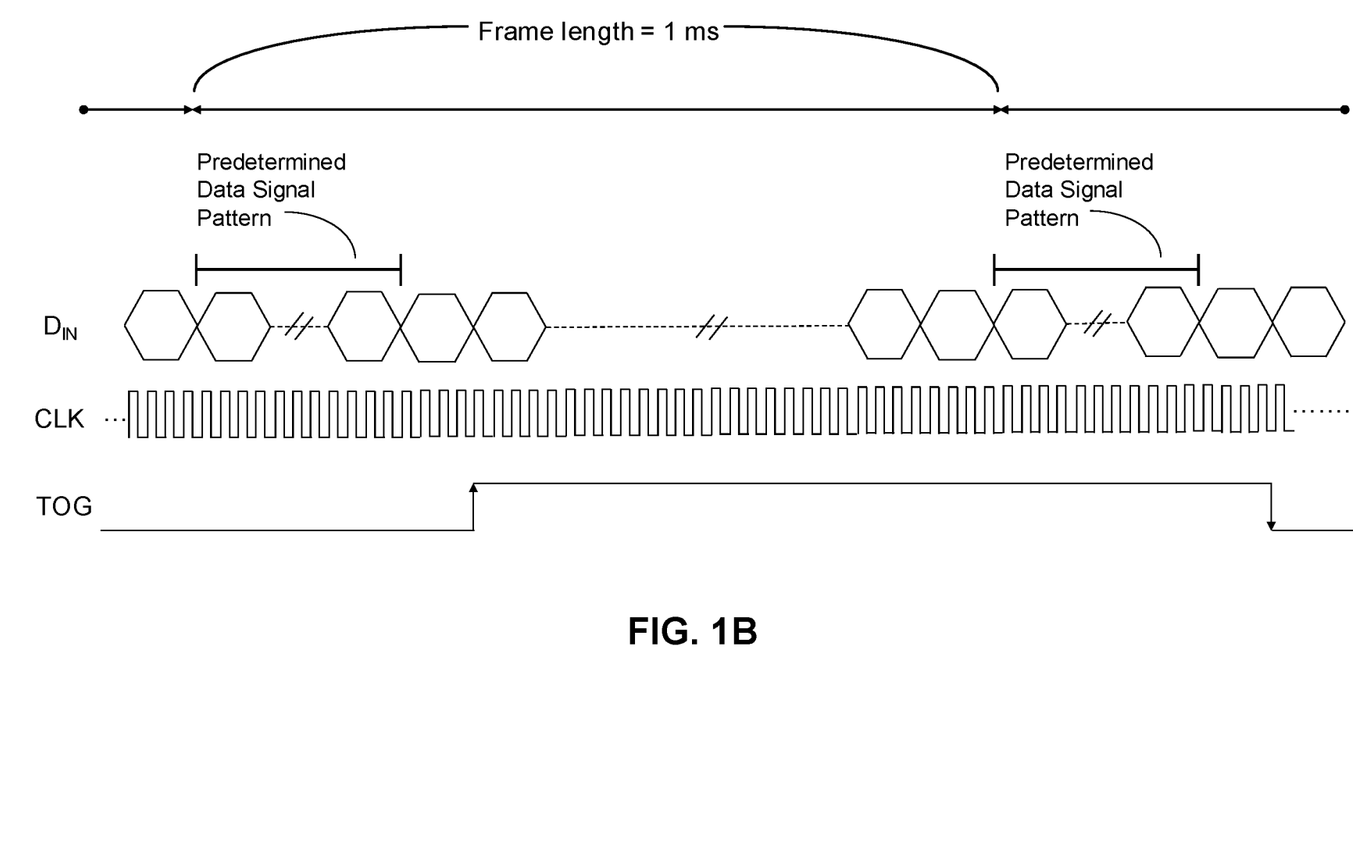
FIG. 1B illustrates a timing diagram for a first set of various signals for the CGC circuit, in accordance with an embodiment.

FIG. 1B illustrates a timing diagram for a first set of various signals for the CGC circuit 100, in accordance with an embodiment. This first set of various signals includes an input data signal DIN, a clock signal CLK, and a toggle signal TOG. In this embodiment, the frame length is 1 ms and the predetermined data signal pattern takes place every 1 ms at the start of each frame. The CDR circuit 102 of the CGC circuit 100 receives the input data signal DIN and the clock signal CLK. In this embodiment, the CLK signal is four times the frequency of the input data signal DIN. The CDR circuit 102 is oversampling the input data signal DIN based on the clock signal CLK to generate a recovered data signal $D_{REC}$ (not shown). The SOF detector circuit 104 of the CGC circuit 100 compares the recovered data signal $D_{REC}$ with the predetermined data signal pattern. Based on the comparison, the SOF detector circuit 104 detects the presence of the predetermined data signal pattern in the recovered data signal $D_{REC}$ and generates the toggle signal TOG. The toggle signal TOG is toggled between a logic low state to a logic high state based on the occurrence of the predetermined data signal pattern. The toggle signal TOG is toggled between the logic high state to the logic low state based on the next occurrence of the predetermined data signal pattern.

Figure 1C:
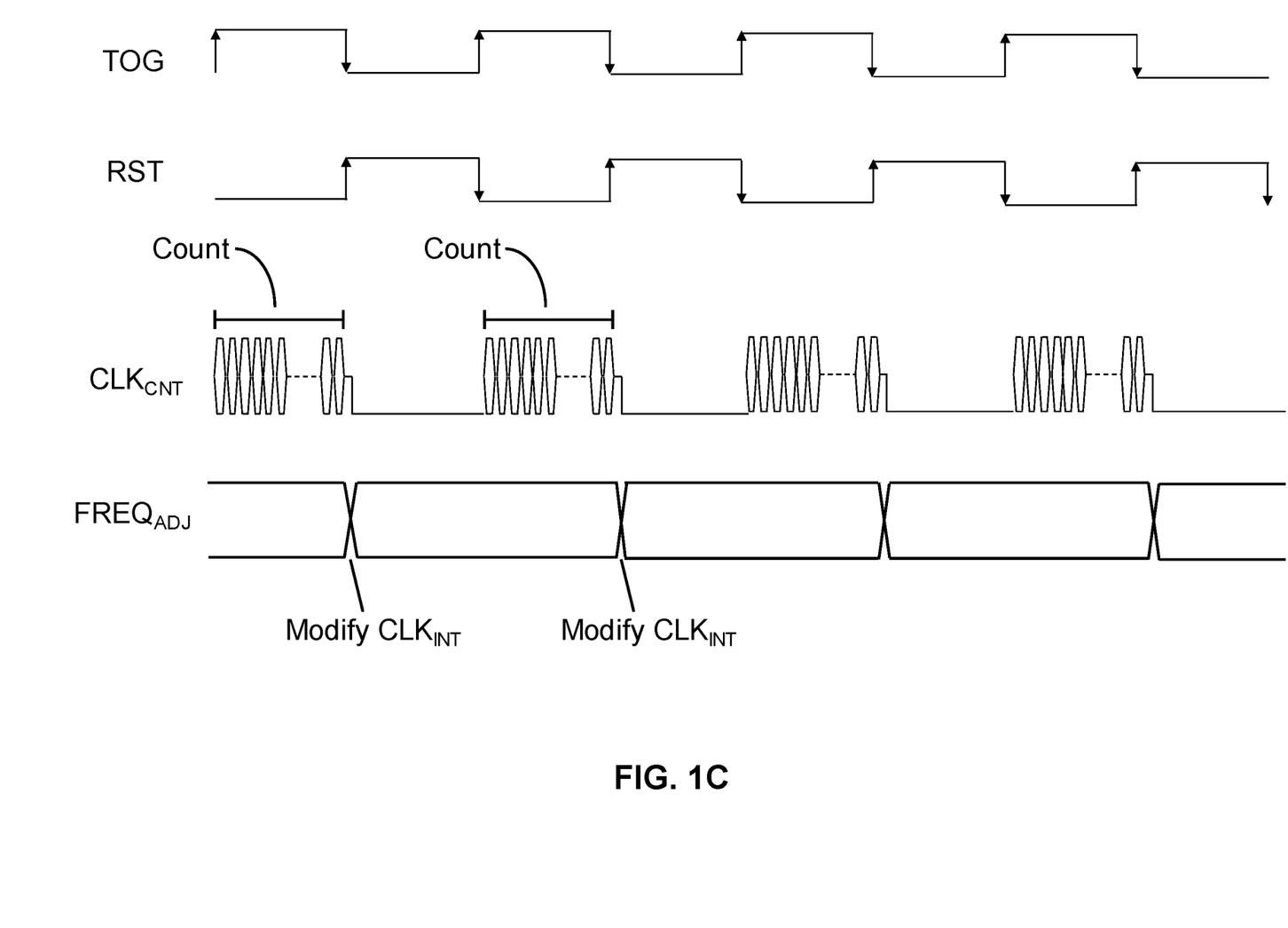
FIG. 1C illustrates a timing diagram for a second set of various signals for the CGC circuit, in accordance with an embodiment.

FIG. 1C illustrates a timing diagram for a second set of various signals for the CGC circuit 100, in accordance with an embodiment. This second set of various signals includes the toggle signal TOG (seen in FIG. 1B), a reset signal RST, a clock cycle count $CLK_{CNT}$ signal, and a frequency adjustment signal $FREQ_{ADJ}$. The counter 106 of the CGC circuit 100 receives the clock signal CLK and the toggle signal TOG. In this embodiment, the counter 106 is activated when the toggle signal TOG is at the logic high state and is deactivated when the toggle signal TOG is at the logic low state. The activated counter 106 counts clock cycles and generates a clock cycle count $CLK_{CNT}$. The clock cycle count $CLK_{CNT}$ indicates the count of the clock cycles that have elapsed in the time interval between two consecutive predetermined data signal patterns of the recovered data signal $D_{REC}$. The counter 106 also receives the reset signal RST. In this embodiment, when the reset signal RST is at logic low state, the counter 106 increments the clock cycle count $CLK_{CNT}$ by one for every clock cycle of the clock signal CLK. When the reset signal RST is at logic high state, the counter 106 resets the clock cycle count $CLK_{CNT}$ to zero.

The digital logic circuit 108 receives the clock cycle count $CLK_{CNT}$ and the toggle signal TOG. In this embodiment, when the toggle signal TOG toggles from the logic high state to the logic low state, the digital logic circuit 108 stores the value of the clock cycle count $CLK_{CNT}$. The digital logic circuit 108 also receives a target count value (i.e., a desired count of clock cycles). The digital logic circuit 108 subtracts the value of the target count from the value of the stored clock cycle count $CLK_{CNT}$ to generate an error count. The digital logic circuit 108 generates the frequency adjustment signal $FREQ_{ADJ}$ based on the error count. The frequency adjustment signal $FREQ_{ADJ}$ is used by the fractional-N PLL 110 to modify an intermediate clock signal $CLK_{INT}$ (not shown). The intermediate clock signal $CLK_{INT}$ is supplied by the oscillator circuit 112. The modification is a frequency adjustment of the intermediate clock signal $CLK_{INT}$. The modified intermediate clock signal $CLK_{INT}$ is output by the fractional-N PLL 110 as the clock signal CLK.

The terms logic high and low states have been used herein to distinguish between high and low signals. For example, the logic low state could signify a signal that is 0 V while a logic high state would then indicate a signal that has a logical '1' value, with the actual voltage value for logic 1 depending on circuit technology. The circuits described herein can also be designed using either positive or negative logic.

Example Process Overview

Figure 2:
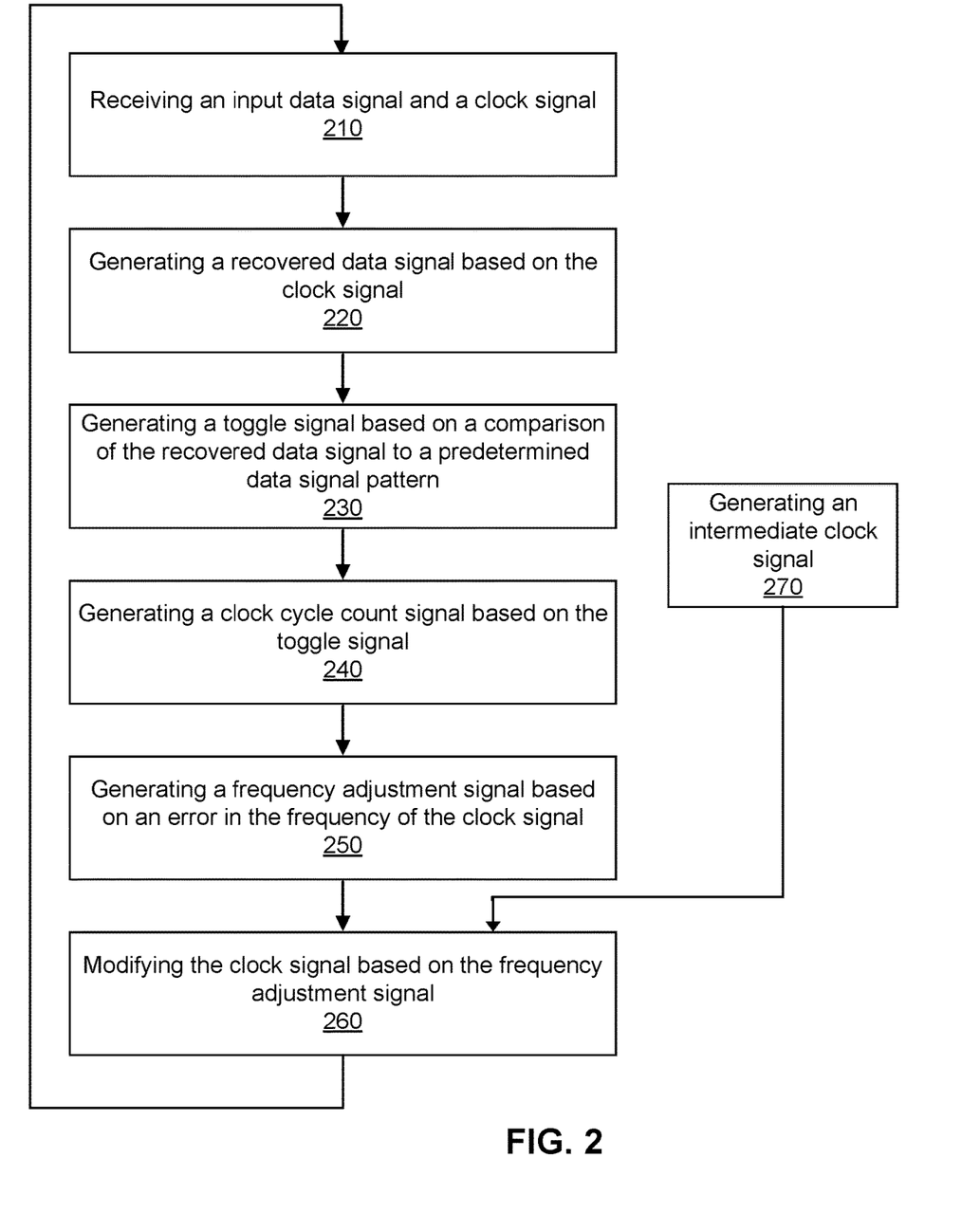
FIG. 2 is a flowchart illustrating an example process (method) for generating and correcting a clock signal, in accordance with one or more embodiments.

FIG. 2 is a flowchart illustrating an example process (method) for generating and correcting a clock signal, in accordance with one or more embodiments. The process shown in FIG. 2 may be performed by components of the CGC circuit 100. Other entities may perform some or all of the steps in FIG. 2 in other embodiments. Embodiments may include different and/or additional steps and/or perform the steps in different orders.

A clock generation and correction circuit (CGC) receives 210 an input data signal and a clock signal. In one embodiment, the input data signal may be provided by a data transmitter as part of a communication system. The clock signal is an internal local clock signal of the CGC circuit. The input data signal and clock signal may be received by a clock and data recovery (CDR) circuit (e.g., the CDR circuit 102), a component of the CGC circuit. The input data signal may include a sequence of frames, where each frame may include a predetermined data signal pattern that may take place at a particular time marker. In one embodiment, the predetermined data signal pattern may be a fixed bit pattern. In some embodiments, the predetermined data signal pattern may take place at a particular time marker, e.g., the start-of-frame (SOF). In other embodiments, the predetermined data signal pattern is determined by the device protocols.

The CGC circuit generates 220 a recovered data signal based on the clock signal. In one embodiment, the CDR circuit may oversample the input data signal based on the clock signal to generate a recovered data signal. The recovered data signal may include the predetermined data signal pattern.

The CGC circuit generates 230 a toggle signal based on a comparison of the recovered data signal to the predetermined data signal pattern. The recovered data signal may be provided to a start-of-frame (SOF) detector circuit (e.g., the SOF detector circuit 104), a component of the CGC circuit. The predetermined data signal pattern, as described above, may be stored in the SOF detector circuit. The SOF detector circuit may compare the recovered data signal with the predetermined data signal pattern. Based on the comparison, the SOF detector circuit may detect the presence of the predetermined data signal pattern in the recovered data signal and may generate a toggle signal. The toggle signal is a digital signal having a logic low state (i.e., "0") or a logic high state (i.e., "1"). When the predetermined data signal pattern has been detected in the recovered data signal, the SOF detector circuit toggles the toggle signal from either a logic low state to a logic high state or from a logic high state to a logic low state.

The CGC circuit generates 240 a clock cycle count signal based on the toggle signal. The toggle signal may be provided to a counter (e.g., the counter 106) a component of the CGC circuit. In addition, the counter may receive the clock signal. In one embodiment, the counter may be activated when the toggle signal is at logic high state, and the counter may be deactivated when the toggle signal is at logic low state. When the counter is activated, the counter may count clock cycles and may generate a clock cycle count. The clock cycle count may indicate a count of the clock cycles that have elapsed in a time interval between two consecutive predetermined data signal patterns of the recovered data signal. The counter may also receive a reset signal. In one embodiment, when the reset signal is at logic low state, the counter may increment the clock cycle count by one for every clock cycle of the clock signal. In the same embodiment, when the reset signal is at logic high state, the counter may reset the clock cycle count to zero.

The CGC circuit generates 250 a frequency adjustment signal based on an error in the frequency of the clock signal. The error in the frequency of the clock signal may be determined by a digital logic circuit (e.g., the digital logic circuit 108) a component of the CGC circuit. The digital logic circuit may receive the clock cycle count and the toggle signal. In one embodiment, when the toggle signal toggles from the logic high state to the logic low state, the digital logic circuit stores the value of the clock cycle count. The digital logic circuit may also receive a target count. The target count may be a desired count of clock cycles and may be determined based on a desired frequency of the clock signal and the time interval between two consecutive predetermined data signal patterns of the recovered data signal. In one embodiment, the value of the target count may be subtracted from the value of the stored clock cycle count to generate an error count. The error count may indicate an error in the frequency of the clock signal with reference to the desired frequency. In some embodiments, the digital logic circuit may generate a frequency adjustment signal based on the error count. The frequency adjustment signal may be proportional to the error count and may also give direction so the clock signal frequency may be adjusted accordingly.

The CGC circuit modifies 260 the local clock signal based on the frequency adjustment signal. The frequency adjustment signal may be provided to a fractional-N Phase Lock Loop (PLL) (e.g., the fractional-N PLL 110) a component of the CGC circuit. The fractional-N PLL may also receive an intermediate clock signal. The generation of the intermediate clock signal is discussed in more detail below. The fractional-N PLL may modify the frequency of the intermediate clock signal based on the frequency adjustment signal. The modification to the intermediate clock signal may take place by multiplying the frequency of intermediate clock signal by a ratio 'N' to generate a corrected frequency for the clock signal.

The CGC circuit generates 270 an intermediate clock signal. In one embodiment, the intermediate clock signal may be generated by an oscillator circuit (e.g., the oscillator circuit 112) that may be a part of the CGC circuit. The oscillator circuit may generate the intermediate clock signal. The frequency of the intermediate clock signal may be determined based on the desired frequency of the clock signal. In one embodiment, the oscillator circuit may be a resistor-capacitor (RC) oscillator circuit.

Additional Considerations

The foregoing description of the embodiments has been presented for illustration; it is not intended to be exhaustive or to limit the patent rights to the precise forms disclosed. Persons skilled in the relevant art can appreciate that many modifications and variations are possible considering the above disclosure.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, circuits, modules, or mechanisms. Modules may constitute hardware modules. A hardware module is a tangible unit capable of performing certain operations and may be configured or arranged in a certain manner.

In various embodiments, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module, in dedicated and permanently configured circuitry, or in temporarily configured circuitry (e.g., configured by software) may be driven by cost and time considerations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for generating and correcting a clock signal of a digital circuit through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A clock generation and correction (CGC) circuit comprising:
   a clock and data recovery (CDR) circuit configured to receive an input data signal and a clock signal and generate a recovered data signal, wherein the recovered data signal is an oversampled input data signal based on the clock signal;
   a start-of-frame (SOF) detector circuit configured to receive the recovered data signal from the CDR circuit and switch a toggle signal from a first output to a second output based on a detected match between the recovered data signal with a predetermined data signal pattern indicating a sequence of bits;
   a counter configured to receive the clock signal and the toggle signal, wherein the counter is configured to generate a clock cycle count signal based on a count of clock cycles of the clock signal when the toggle signal is at the second output;
   a digital logic circuit configured to receive the toggle signal and the clock cycle count signal and generate a frequency adjustment signal based on an error in a frequency of the clock signal; and
   a fractional-N Phase Lock Loop (PLL) circuit configured to receive the frequency adjustment signal and modify the clock signal based on the frequency adjustment signal.

2. The CGC circuit of claim 1, wherein the input data signal comprises a sequence of frames, each frame comprises the predetermined data signal pattern taking place at a particular time marker.

3. The CGC circuit of claim 1, wherein the CDR circuit is further configured to operate at a desired frequency of the clock signal, and wherein the desired frequency of the clock signal is calculated by multiplying a data transmission rate of the input data signal and an oversampling factor.

4. The CGC circuit of claim 1, wherein the predetermined data signal pattern is a fixed bit pattern at a particular time marker.

5. The CGC circuit of claim 1, wherein the digital logic circuit is further configured to receive a target count signal and generate an error count value, and wherein the error count value is the error in the frequency of the clock signal.

6. The CGC circuit of claim 1, wherein the CDR circuit, the SOF detector circuit, the counter, the digital logic circuit, and the fractional-N PLL circuit are configured to form a feedback loop.

7. The CGC circuit of claim 1, wherein the sequence of bits is a SOF packet.

8. The CGC circuit of claim 1, further comprising:
an oscillator circuit configured to generate an intermediate clock signal.

9. The CGC circuit of claim 8, wherein the modification to the clock signal is determined by multiplying the frequency of the intermediate clock signal by a ratio to generate a modified frequency for the clock signal.

10. A method for clock generation and correction comprising:
receiving an input data signal and a clock signal;
generating, by a clock and data recovery (CDR) circuit, a recovered data signal, wherein the recovered data signal is an oversampled input data signal based on the clock signal;
switching, by a start-of-frame (SOF) detector circuit, a toggle signal from a first output to a second output based on a detected match between the recovered data signal with a predetermined data signal pattern indicating a sequence of bits;
generating, by a counter, when the toggle signal is at the second output, a clock cycle count signal, the clock cycle count signal based on a count of clock cycles of the clock signal;
outputting, by the counter, when the toggle signal is at the second output, the clock cycle count signal;
generating, by a digital logic circuit, a frequency adjustment signal based on an error in a frequency of the clock signal; and
modifying, by a fractional-N Phase Lock Loop (PLL) circuit, the clock signal based on the frequency adjustment signal.

11. The method of claim 10, wherein the input data signal comprises a sequence of frames, each frame comprises the predetermined data signal pattern taking place at a particular time marker.

12. The method of claim 10, wherein the CDR circuit operates at a desired frequency of the clock signal, and wherein the desired frequency of the clock signal is calculated by multiplying a data transmission rate of the input data signal and an oversampling factor.

13. The method of claim 10, wherein the predetermined data signal pattern is a fixed bit pattern at a particular time marker.

14. The method of claim 10, further comprising:
receiving, by the digital logic circuit, a target count signal; and
generating, by the digital logic circuit, an error count value, wherein the error count value is the error in the frequency of the clock signal.

15. The method of claim 10, wherein the CDR circuit, the SOF detector circuit, the counter, the digital logic circuit, and the fractional-N PLL circuit are configured to form a feedback loop.

16. The method of claim 10, wherein the sequence of bits is a SOF packet.

17. The method of claim 10, further comprising:
generating, by an oscillator, an intermediate clock signal.

18. The method of claim 17, wherein modifying, by the fractional-N Phase Lock Loop (PLL) circuit, the clock signal further comprises multiplying the frequency of the intermediate clock signal by a ratio to generate a modified frequency for the clock signal.

* * * * *